(12) United States Patent
Kim

(10) Patent No.: US 11,742,331 B2
(45) Date of Patent: *Aug. 29, 2023

(54) METHOD OF MANUFACTURING A SEMICONDUCTOR PACKAGE INCLUDING A DAM STRUCTURE SURROUNDING A SEMICONDUCTOR CHIP MOUNTING REGION

(71) Applicant: Samsung Electronics Co., Ltd., Suwon-si (KR)

(72) Inventor: Minsoo Kim, Suwon-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/674,337

(22) Filed: Feb. 17, 2022

(65) Prior Publication Data

US 2022/0173076 A1 Jun. 2, 2022

Related U.S. Application Data

(62) Division of application No. 16/886,141, filed on May 28, 2020, now Pat. No. 11,289,454.

(30) Foreign Application Priority Data

Oct. 14, 2019 (KR) .......................... 10-2019-0127158

(51) Int. Cl.
| | |
|---|---|
| *H01L 25/065* | (2023.01) |
| *H01L 25/18* | (2023.01) |
| *H01L 23/31* | (2006.01) |

(52) U.S. Cl.
CPC ...... *H01L 25/0657* (2013.01); *H01L 23/3128* (2013.01); *H01L 25/18* (2013.01);
(Continued)

(58) Field of Classification Search
CPC . H01L 25/0657; H01L 25/18; H01L 23/3128; H01L 2225/06541; H01L 2225/06517; H01L 2225/06586; H01L 2225/06513; H01L 2225/06527; H01L 2225/06565; H01L 21/561; H01L 25/50;
(Continued)

(56) References Cited

U.S. PATENT DOCUMENTS

| | | |
|---|---|---|
| 6,291,264 B1 | 9/2001 | Tang et al. |
| 6,627,979 B2 * | 9/2003 | Park .................. H01L 24/13 |
| | | 257/667 |

(Continued)

*Primary Examiner* — Mamadou L Diallo
(74) *Attorney, Agent, or Firm* — Harness, Dickey & Pierce, P.L.C.

(57) ABSTRACT

A semiconductor package includes a base substrate, a first semiconductor chip on the base substrate, a dam structure on the base substrate and surrounding the first semiconductor chip, a second semiconductor chip on the first semiconductor chip, a non-conductive film, and a molding member. The non-conductive film may be between the base substrate, the first semiconductor chip, and the second semiconductor chip. The molding member may cover the base substrate, the first semiconductor chip, and the second semiconductor chip. A level of an upper surface of the first semiconductor chip and a level of an upper surface of the dam structure may be at a same level.

20 Claims, 19 Drawing Sheets

(52) U.S. Cl.
CPC ............... *H01L 2225/06513* (2013.01); *H01L 2225/06517* (2013.01); *H01L 2225/06541* (2013.01); *H01L 2225/06586* (2013.01)

(58) Field of Classification Search
CPC ............... H01L 21/563; H01L 23/3135; H01L 23/3185; H01L 23/13; H01L 23/31; H01L 23/481; H01L 23/49827
See application file for complete search history.

(56) References Cited

U.S. PATENT DOCUMENTS

| | | | |
|---|---|---|---|
| 8,350,383 B2 | 1/2013 | Daubenspeck et al. | |
| 8,399,300 B2 | 3/2013 | Lee et al. | |
| 8,604,615 B2* | 12/2013 | Lee | H01L 25/0655 |
| | | | 257/734 |
| 9,735,043 B2 | 8/2017 | Ho et al. | |
| 10,103,095 B2 | 10/2018 | Pun et al. | |
| 2009/0154128 A1 | 6/2009 | Tamadate | |
| 2009/0243051 A1* | 10/2009 | Vanam | H01L 24/97 |
| | | | 257/659 |
| 2012/0049352 A1* | 3/2012 | Kang | H01L 23/367 |
| | | | 257/737 |
| 2012/0119346 A1* | 5/2012 | Im | H01L 21/563 |
| | | | 257/E23.18 |
| 2013/0043568 A1* | 2/2013 | Song | H01L 23/49805 |
| | | | 257/659 |
| 2014/0183724 A1* | 7/2014 | Yang | H01L 21/563 |
| | | | 257/737 |
| 2015/0179588 A1* | 6/2015 | Choi | H01L 23/552 |
| | | | 257/659 |
| 2015/0348930 A1* | 12/2015 | Jeong | H01L 23/49838 |
| | | | 257/737 |
| 2016/0013115 A1* | 1/2016 | Vadhavkar | H01L 23/36 |
| | | | 257/713 |
| 2016/0013173 A1* | 1/2016 | Vadhavkar | H01L 23/44 |
| | | | 438/109 |
| 2017/0154868 A1* | 6/2017 | Jo | H01L 25/0652 |
| 2018/0323118 A1 | 11/2018 | Wang et al. | |
| 2019/0172791 A1* | 6/2019 | Kawabata | H01L 23/49805 |
| 2019/0189553 A1* | 6/2019 | Hohlfeld | H01L 23/49861 |
| 2020/0058618 A1* | 2/2020 | Hsieh | H01L 24/01 |
| 2021/0066155 A1* | 3/2021 | Nofen | H01L 25/18 |

* cited by examiner

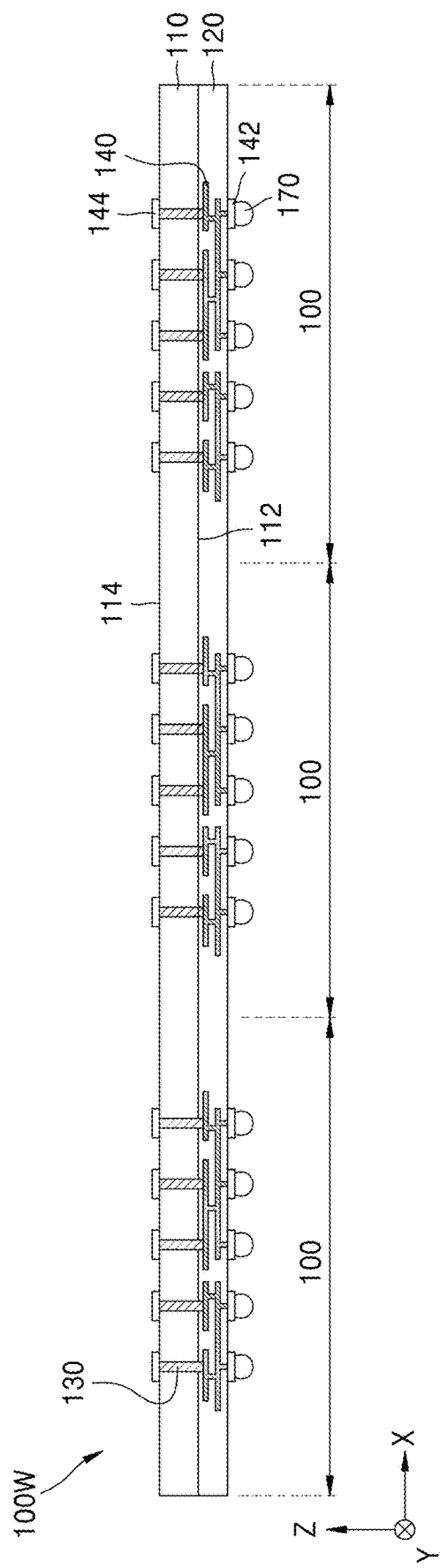

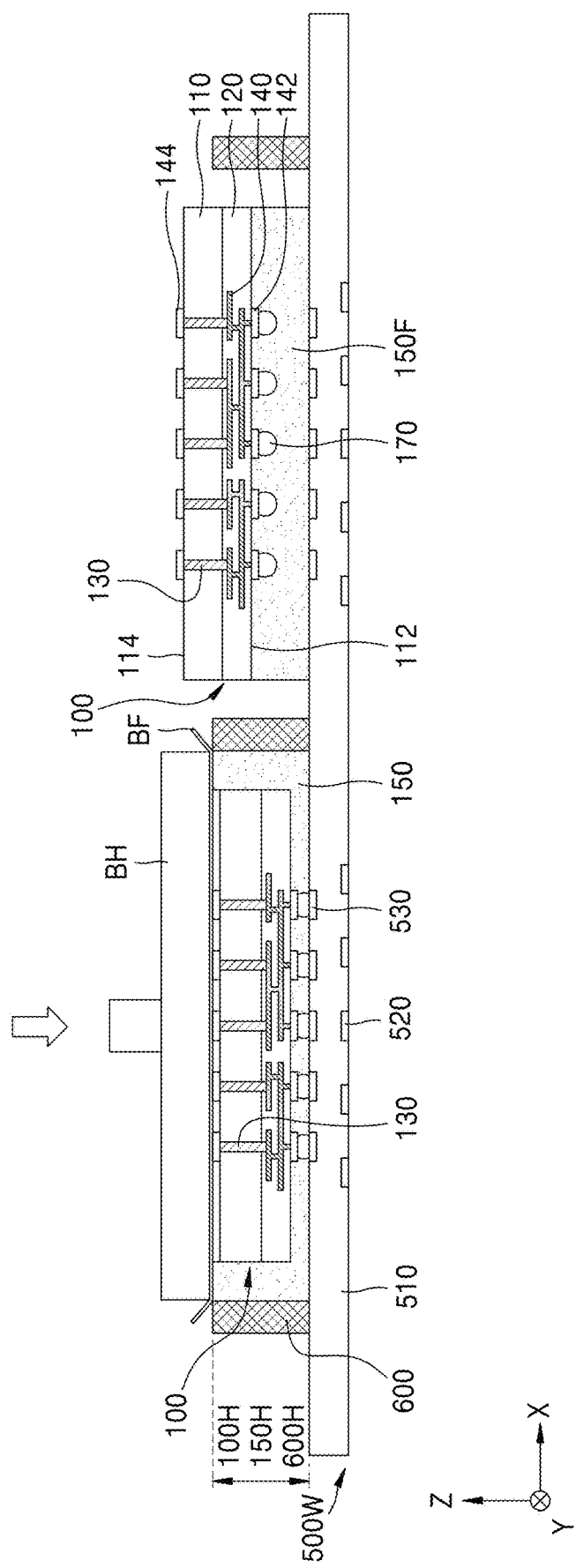

METHOD OF MANUFACTURING A SEMICONDUCTOR PACKAGE INCLUDING A DAM STRUCTURE SURROUNDING A SEMICONDUCTOR CHIP MOUNTING REGION

CROSS-REFERENCE TO RELATED APPLICATION

This application is a divisional of U.S. application Ser. No. 16/886,141, filed May 28, 2020, which claims the benefit of Korean Patent Application No. 10-2019-0127158, filed on Oct. 14, 2019, in the Korean Intellectual Property Office, the disclosure of each of which is incorporated herein in its entirety by reference.

BACKGROUND

Inventive concepts relate to a semiconductor package, and more particularly, to a semiconductor package including a non-conductive film.

Recently, in the electronic products market, the demand for portable electronic devices is rapidly increasing, and thus, miniaturized and lightweight electronic elements, which are equipped in the portable electronic devices, are continuously desired. In addition to technology for reducing an individual size of each electronic element, semiconductor package technology for integrating a plurality of semiconductor chips of each element into one package is needed for miniaturizing and lightening electronic elements.

SUMMARY

Some inventive concepts relate to a semiconductor package including a non-conductive film for stacking semiconductor chips so as to realize miniaturization, lightness, high performance, and/or a large capacity.

In one embodiment, a semiconductor package includes a base substrate; a first semiconductor chip on the base substrate; a dam structure on the base substrate; a second semiconductor chip on the first semiconductor chip; a non-conductive film between the base substrate, the first semiconductor chip, and the second semiconductor chip; and a molding member covering the base substrate, the first semiconductor chip, and the second semiconductor chip. The dam structure may surround the first semiconductor chip. A level of an upper surface of the dam structure may be at a level of an upper surface of the first semiconductor chip.

In one embodiment, a semiconductor package includes a base substrate, a semiconductor chip on the base substrate, a dam structure on the base substrate and surrounding the semiconductor chip, a non-conductive film between the base substrate and the semiconductor chip, and a molding member covering the base substrate and the semiconductor chip. A level of an upper surface of the non-conductive film may be at a level of an upper surface of the semiconductor chip and a level of an upper surface of the dam structure.

In one embodiment, a semiconductor package includes a base substrate, a plurality of semiconductor chips on the base substrate, a dam structure on the base substrate and surrounding a lowermost semiconductor chip among the plurality of semiconductor chips, a plurality of connection bumps, a plurality of non-conductive films, and a molding member covering the base substrate and the plurality of semiconductor chips. Each of the plurality of semiconductor chips may include a through electrode. The plurality of connection bumps may include first connection bumps and other connection bumps. The first connection bumps may be between the base substrate and the lowermost semiconductor chip. The first connection bumps may be connected to the through electrode of the lowermost semiconductor chip. The other connection bumps may be between each two adjacent semiconductor chips of the plurality of semiconductor chips and connected to the through electrodes of the each two adjacent semiconductor chips of the plurality of semiconductor chips. A level of an upper surface of the lowermost semiconductor chip may be at a level of an upper surface of the dam structure. The plurality of non-conductive films may include a lowermost non-conductive film and other non-conductive films. The lowermost non-conductive film may be between the base substrate and the lowermost semiconductor chip. The other non-conductive films may be between each two adjacent semiconductor chips of the plurality of semiconductor chips.

BRIEF DESCRIPTION OF THE DRAWINGS

Some embodiments of inventive concepts will be more clearly understood from the following detailed description taken in conjunction with the accompanying drawings in which:

FIGS. 6A to 6J are diagrams illustrating a method of manufacturing a semiconductor package in process sequence, according to an embodiment.

DETAILED DESCRIPTION

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, embodiments will be described in detail with reference to the accompanying drawings.

Figure 1A:
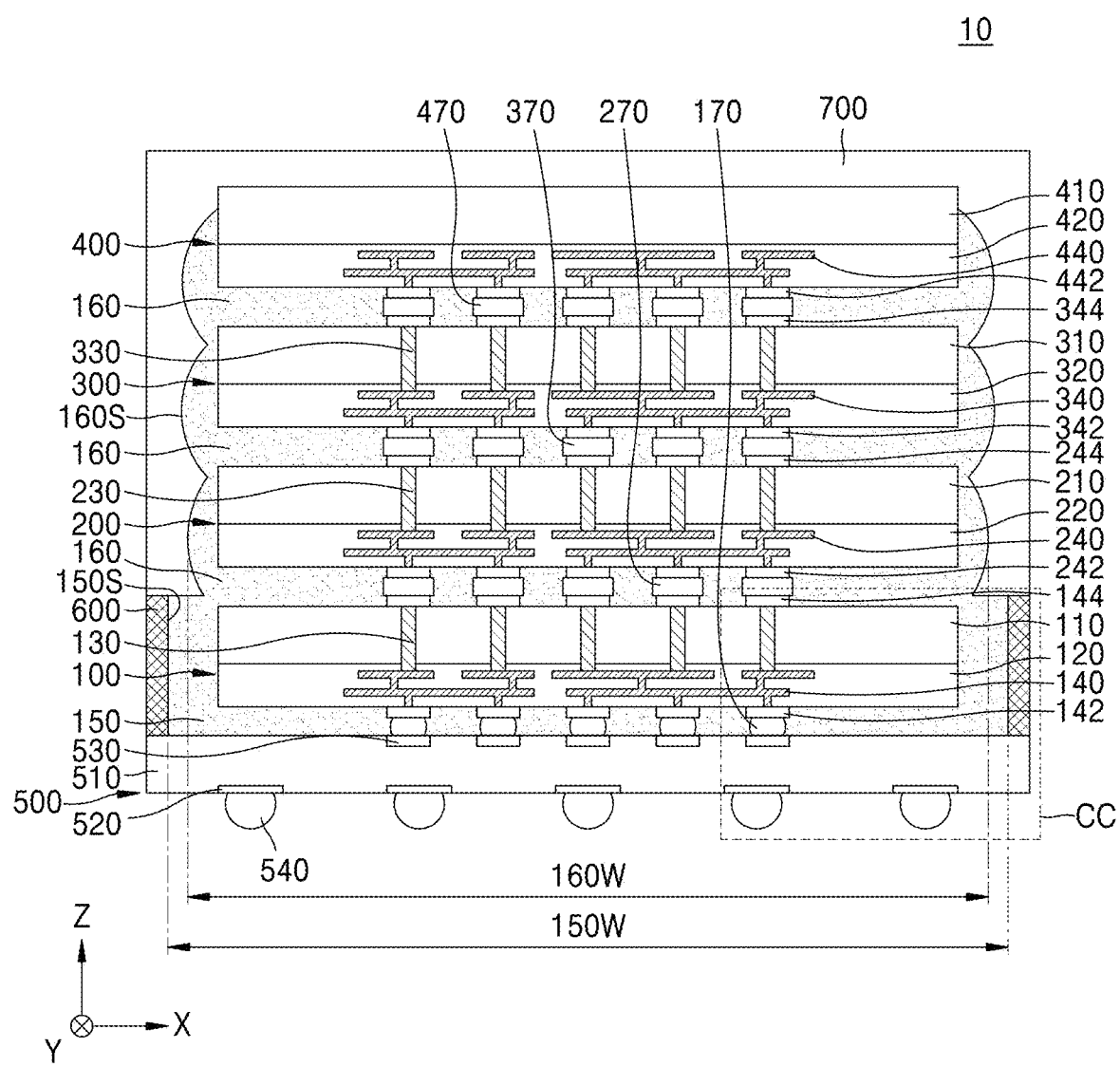
FIGS. 1A to 1C are diagrams illustrating a semiconductor package according to an embodiment.
Figure 1B:
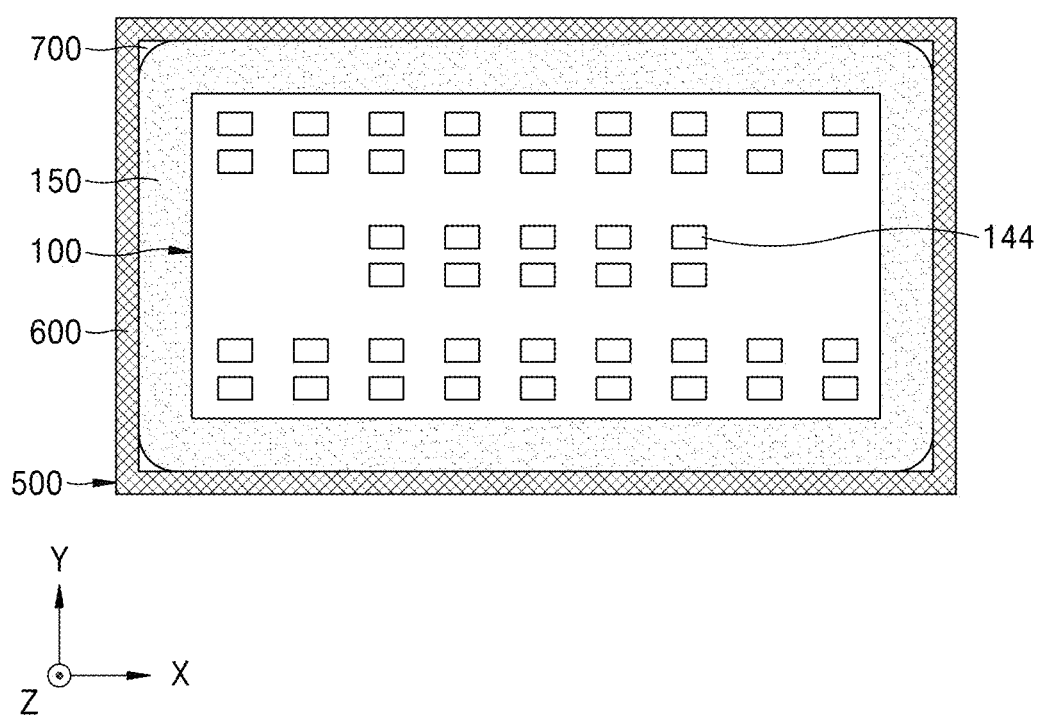
Figure 1C:
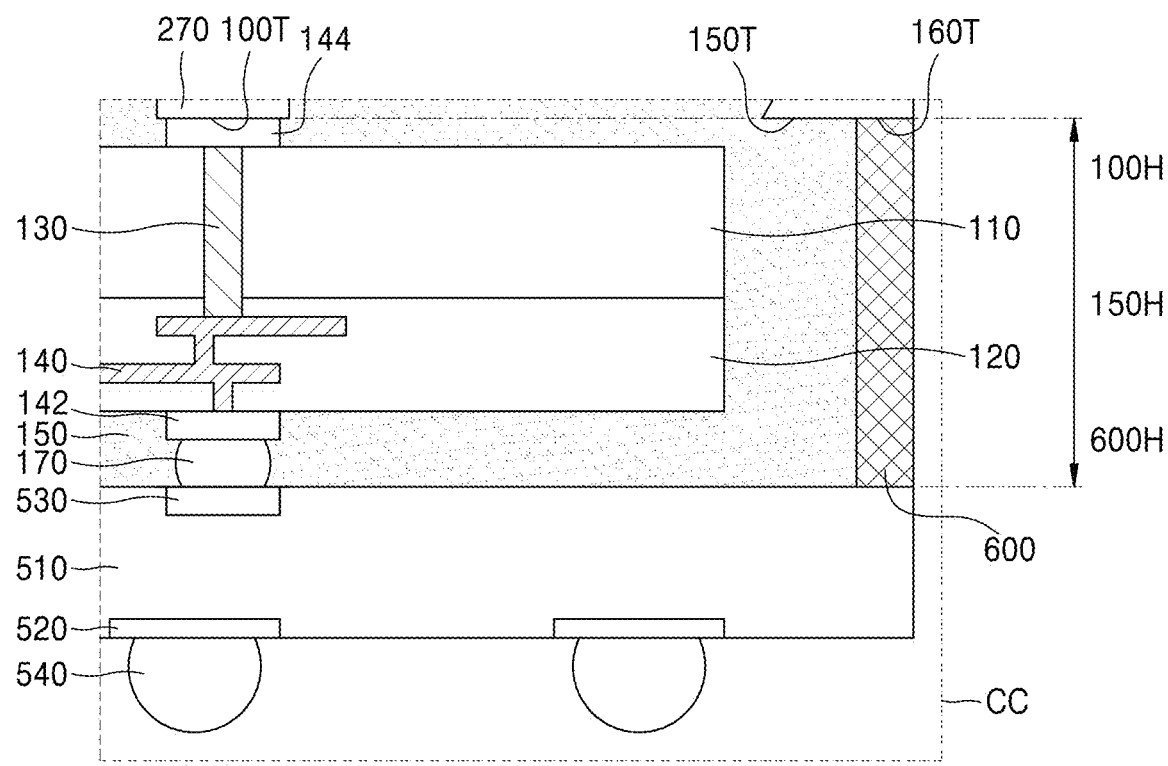

FIGS. 1A to 1C are diagrams illustrating a semiconductor package 10 according to an embodiment.

In detail, FIG. 1A is a side cross-sectional view of the semiconductor package 10, FIG. 1B is a plan view of the semiconductor package 10, and FIG. 1C is an enlarged view of a region CC of FIG. 1A.

Referring to FIGS. 1A to 1C, the semiconductor package 10 may include a first semiconductor chip 100, a second semiconductor chip 200, a third semiconductor chip 300, and a fourth semiconductor chip 400, which are stacked on a base substrate 500 in a vertical direction (a Z direction).

The first to fourth semiconductor chips 100 to 400 may be electrically connected to one another through first to fourth connection bumps 170, 270, 370, and 470, or may be electrically connected to the base substrate 500. Also, the first to fourth semiconductor chips 100 to 400 and the base substrate 500 may be attached on one another by a non-conductive film (NCF).

In the present embodiment, an NCF disposed between the base substrate 500 and the first semiconductor chip 100 may be referred to as a first NCF 150, and an NCF disposed between the first to fourth semiconductor chips 100 to 400 may be referred to as a second NCF 160. A material of the first NCF 150 may be the same as that of the second NCF 160. An NCF will be described below in detail.

The first to fourth semiconductor chips 100 to 400 may each include a logic chip or a memory chip. For example, the first to fourth semiconductor chips 100 to 400 may include the same memory chips, or some of the first to fourth semiconductor chips 100 to 400 may include memory chips and the other semiconductor chips may include logic chips.

Each of the memory chips may include, for example, a volatile memory chip such as dynamic random access memory (RAM) (DRAM) or static RAM (SRAM), or may include a non-volatile memory chip such as phase-change RAM (PRAM), magnetoresistive RAM (MRAM), ferro-electric RAM (FeRAM), or resistive RAM (RRAM). In some embodiments, the first to fourth semiconductor chips 100 to 400 may each include a high bandwidth memory (HBM). Also, the logic chips may each include, for example, a microprocessor, an analog element, a digital signal processor, or an application processor.

An example where the first to fourth semiconductor chips 100 to 400 are stacked is illustrated, but the number of semiconductor chips stacked in the semiconductor package 10 is not limited thereto. For example, two or more semiconductor chips may be stacked in the semiconductor package 10.

The first semiconductor chip 100 may include a first semiconductor substrate 110, a first semiconductor device layer 120, a first through electrode 130, a first lower connection pad 142, a first upper connection pad 144, and the first connection bump 170.

The first semiconductor substrate 110 may include an active surface (a lower surface as illustrated) and an inactive surface (an upper surface as illustrated), which are opposite to each other. The first semiconductor substrate 110 may have the first semiconductor device layer 120 provided on the lower surface of the first semiconductor substrate 110. The first through electrode 130 may pass through the first semiconductor substrate 110 and may extend from the upper surface of the first semiconductor substrate 110 to the lower surface of the first semiconductor substrate 110, and moreover, may be connected to a first wiring structure 140 included in the first semiconductor device layer 120. The first lower connection pad 142 may be formed in the first semiconductor device layer 120 and may be electrically connected to the first through electrode 130 through the first wiring structure 140.

The first semiconductor substrate 110 may include, for example, silicon (Si). Alternatively, the first semiconductor substrate 110 may include a semiconductor element such as germanium (Ge) or a compound semiconductor such as silicon carbide (SiC), gallium arsenide (GaAs), indium arsenide (InAs), or indium phosphide (InP). Alternatively, the first semiconductor substrate 110 may have a silicon on insulator (SOI) structure. For example, the first semiconductor substrate 110 may include a buried oxide layer (BOX) layer. The first semiconductor substrate 110 may include a conductive region (for example, an impurity-doped well or an impurity-doped structure). Also, the first semiconductor substrate 110 may have various isolation structures such as a shallow trench isolation (STI) structure.

The first semiconductor device layer 120 may include the first wiring structure 140 for connecting a plurality of individual devices (for example, an integrated circuit device, a semiconductor device, a passive device, etc.) to another wiring formed on the first semiconductor substrate 110. The first wiring structure 140 may include a metal wiring layer and a via plug. For example, the first wiring structure 140 may be a multi-layer structure where two or more metal wiring layers or two or more via plugs are alternately stacked.

The first through electrode 130 may extend from the upper surface of the first semiconductor substrate 110 to the lower surface of the first semiconductor substrate 110, and moreover, may extend to an inner portion of the first semiconductor device layer 120 and may be electrically connected to the first wiring structure 140. At least a portion of the first through electrode 130 may have a pillar shape.

The first lower connection pad 142 may be disposed on the first semiconductor device layer 120 and may be electrically connected to the first wiring structure 140 of the first semiconductor device layer 120. The first lower connection pad 142 may be electrically connected to the first through electrode 130 through the first wiring structure 140. The first lower connection pad 142 may include at least one material selected from among aluminum (Al), copper (Cu), nickel (Ni), tungsten (W), platinum (Pt), and gold (Au).

Although not shown, a lower passivation layer for protecting the first wiring structure 140 of the first semiconductor device layer 120 and other structures thereunder from an external impact or moisture may be formed on the first semiconductor device layer 120. The lower passivation layer may expose a portion of an upper surface of the first lower connection pad 142.

The first upper connection pad 144 electrically connected to the first through electrode 130 may be formed on the upper surface of the first semiconductor substrate 110. The first upper connection pad 144 may include the same material as that of the first lower connection pad 142. Also, although not shown, an upper passivation layer may be formed to surround a region from the upper surface of the first semiconductor substrate 110 to a portion of a side surface of the first through electrode 130.

The first connection bump 170 may be disposed in contact with the first lower connection pad 142. The first connection bump 170 may electrically connect the first semiconductor chip 100 to the base substrate 500. At least one of a control signal, a power signal, and a ground signal for operations of the first to fourth semiconductor chips 100 to 400 may be provided through the first connection bump 170 from the outside, data signals to be stored in the first to fourth semiconductor chips 100 to 400 may be provided through the first connection bump 170 from the outside, or data stored in the first to fourth semiconductor chips 100 to 400 may be provided to the outside through the first connection bump 170. For example, the first connection bump 170 may include a pillar structure, a ball structure, or a solder layer.

The second semiconductor chip 200 may include a second semiconductor substrate 210, a second semiconductor device layer 220 including a second wiring structure 240, a second through electrode 230, a second lower connection pad 242, a second upper connection pad 244, and the second connection bump 270.

The second semiconductor chip 200 may be mounted on an upper surface of the first semiconductor chip 100. The second semiconductor chip 200 may be electrically connected to the first semiconductor chip 100 through the second connection bump 270 disposed between the first semiconductor chip 100 and the second semiconductor chip 200.

Also, the second NCF 160 may be disposed between the upper surface of the first semiconductor chip 100 and a lower surface of the second semiconductor chip 200 and may attach the second semiconductor chip 200 on the first semiconductor chip 100. The second NCF 160, as illustrated, may protrude from side surfaces of the first and second semiconductor chips 100 and 200 in directions toward peripheries of the first and second semiconductor chips 100 and 200, and a portion of the second NCF 160, which protrudes, may cover a portion of each of the side surfaces of the first and second semiconductor chips 100 and 200. In addition, a side surface 160S of the second NCF 160, which protrudes, may form a curve surface.

The third semiconductor chip 300 may include a third semiconductor substrate 310, a third semiconductor device layer 320 including a third wiring structure 340, a third through electrode 330, a third lower connection pad 342, a third upper connection pad 344, and the third connection bump 370.

The fourth semiconductor chip 400 may include a fourth semiconductor substrate 410, a fourth semiconductor device layer 420 including a fourth wiring structure 440, a fourth lower connection pad 442, and the fourth connection bump 470. The fourth semiconductor chip 400, unlike the first to third semiconductor chips 100 to 300, may not include a through electrode and an upper connection pad.

The third semiconductor chip 300 may be mounted on an upper surface of the second semiconductor chip 200, and the fourth semiconductor chip 400 may be mounted on an upper surface of the third semiconductor chip 300. The third connection bump 370 and the second NCF 160 surrounding a side surface of the third connection bump 370 may be disposed between the second semiconductor chip 200 and the third semiconductor chip 300. Likewise, the third connection bump 470 and the second NCF 160 surrounding a side surface of the fourth connection bump 470 may be disposed between the third semiconductor chip 300 and the fourth semiconductor chip 400.

The second to fourth semiconductor chips 200 to 400 may have a technical feature which is the same as or similar to that of the first semiconductor chip 100, and thus, detailed descriptions of the second to fourth semiconductor chips 200 to 400 are omitted.

The base substrate 500 may be, for example, a printed circuit board (PCB) or an interposer.

When the base substrate 500 is a PCB, the base substrate 500 may include a substrate body part 510, a bottom pad 520, a top pad 530, and a solder resist layer (not shown) formed on each of a lower surface and an upper surface of the substrate body part 510. An internal wiring (not shown) electrically connecting the bottom pad 520 to the top pad 530 may be formed in the substrate body part 510. The bottom pad 520 and the top pad 530 may each be a portion, exposed by the solder resist layer, of a circuit wiring patterned on each of the lower surface and the upper surface of the substrate body part 510.

When the base substrate 500 is an interposer, the base substrate 500 may include a substrate body part 510 including a semiconductor material, a bottom pad 520 formed on a lower surface of the substrate body part 510, and a top pad 530 formed on an upper surface of the substrate body part 510. The substrate body part 510, for example, may be formed from a semiconductor wafer. Also, an internal wiring (not shown) may be formed on the lower surface, the upper surface, or an inner portion of the substrate body part 510. Also, a through via (not shown) electrically connecting the bottom pad 520 to the top pad 530 may be formed in the substrate body part 510.

An external connection terminal 540 may be attached on a lower surface of the base substrate 500. The external connection terminal 540 may be attached on the bottom pad 520. The external connection terminal 540 may include, for example, a solder ball or a bump. The external connection terminal 540 may electrically connect the semiconductor package 10 to an external device (not shown).

Also, the first NCF 150 may be formed between the base substrate 500 and the first semiconductor chip 100. The first NCF 150 may be disposed between the base substrate 500 and the first semiconductor chip 100 and may surround a side surface of the first connection bump 170. The first NCF 150, as illustrated, may protrude from the side surface of the first semiconductor chip 100 in a direction toward a periphery of the first semiconductor chip 100, and the first NCF 150, which protrudes, may cover the side surface of the first semiconductor chip 100. In addition, a side surface 150S of the first NCF 150, which protrudes, may form a flat surface.

An NCF will be described below in more detail. The NCF may include an adhesive resin and a flux. The adhesive resin may attach the NCF on the first to fourth semiconductor chips 100 to 400. The adhesive resin may be, for example, a thermocurable resin.

When heat and pressure are applied to the adhesive resin, the adhesive resin may be changed from a gel state to a liquid state, and then, may be cured. Due to such properties, a side surface of an NCF may form a curve surface in a process of manufacturing a semiconductor package generally. Therefore, the side surface 160S of the second NCF 160 may form a curve surface.

The flux may be used in soldering for electrical bonding between the first to fourth semiconductor chips 100 to 400 in a process of manufacturing a semiconductor package. The flux may enhance the spreadability and wetting of a solder, and the flux may be previously coated on a portion on which a solder is to be coated, or may be included in an NCF. For example, the flux may be classified into a resin group, an organic group, and an inorganic group, and a flux used for electronic devices may be a resin-based flux generally.

A dam structure 600 may be disposed on the base substrate 500 to surround the first semiconductor chip 100. The side surface 150S of the first NCF 150 may contact the dam structure 600 to form a flat surface. The dam structure 600 may be disposed apart from the first semiconductor chip 100 by a certain distance and may be formed in an integrated structure surrounding a whole side surface of the first semiconductor chip 100.

An upper surface 600T of the dam structure 600 may be disposed at a level which is substantially the same as an upper surface 100T of the first semiconductor chip 100. That is, a thickness 600H of the dam structure 600 may be substantially the same as a thickness 100H of the first semiconductor chip 100.

Also, the upper surface 600T of the dam structure 600 may be disposed at a level which is substantially the same as an upper surface 150T of the first NCF 150. That is, the thickness 600H of the dam structure 600 may be substantially the same as a thickness 150H of the first NCF 150.

Therefore, all of the dam structure 600, the first semiconductor chip 100, and the first NCF 150 may have substantially the same thickness.

The dam structure 600 may include a material similar to the material of the NCF described above. However, the material of the dam structure 600 is not limited thereto.

A molding member 700 may be formed on the base substrate 500 to surround the first to fourth semiconductor chips 100 to 400. The molding member 700 may surround side surfaces of the first to fourth semiconductor chips 100 to 400. In detail, the molding member 700 may be formed to surround the side surfaces of the first to fourth semiconductor chips 100 to 400 and a side surface of the second NCF 160 and not to externally expose the first and second NCFs 150 and 160.

In some embodiments, the molding member 700 may cover an upper surface of the fourth semiconductor chip 400. In other embodiments, the molding member 700 may externally expose the upper surface of the fourth semiconductor chip 400. Also, the molding member 700 may be formed to surround the upper surface 600T and an inner sidewall of the dam structure 600. An outer sidewall of the dam structure 600 may be exposed by the molding member 700, and the exposed outer sidewall of the dam structure 600 and a side surface of the molding member 700 may be coplanar. The molding member 700 may include, for example, an epoxy molding compound (EMC). However, a material of the molding member 700 is not limited thereto.

Recently, a semiconductor package applied to electronic products needs miniaturization, lightness, high performance, and a large capacity. Semiconductor chips including a through electrode and a semiconductor package with the semiconductor chips stacked therein are being continuously researched and developed for realizing miniaturization, lightness, high performance, and a large capacity.

Since a thickness of each semiconductor chip is structurally thinned for miniaturizing and lightening a semiconductor package with semiconductor chips stacked therein, an NCF may be used as an interlayer bonding material of a semiconductor package in a stack process performed on semiconductor chips, for uniform adhesiveness, bonding of a connection bump having a fine size, solder wetting, electrical reliability, and structural reliability.

After a process of manufacturing a semiconductor package ends, an interval between final semiconductor chips may be less than a thickness of an initial NCF, and thus, an NCF may flow by a thickness difference in a direction toward a periphery of each semiconductor chip, thereby forming a protrusion portion of the NCF.

However, when the amount of NCF flowing toward a periphery of each semiconductor chip (particularly, in a vertical direction (a Z direction)) is excessively much, several problems such as affecting a process of manufacturing another peripheral semiconductor package may occur. Due to this, the quality of a semiconductor package may be finally degraded.

Therefore, in order to decrease a protrusion portion of an overflowing NCF, a process of manufacturing a semiconductor package may be performed under a condition where a thickness of an NCF is reduced or a viscosity of the NCF is set to be high. In this case, however, non-filling of the NCF may occur. Due to this, stacked semiconductor chips may not uniformly be bonded to one another, or a void between the stacked semiconductor chips may occur.

Furthermore, the base substrate 500 may have an X-Y plane area which is relatively wider than the first to fourth semiconductor chips 100 to 400, and thus, an overflow of the first NCF 150 may be severer than an overflow of the second NCF 160. For the same reason, a width 150W of the first NCF 150 in a horizontal direction (an X direction) may be greater than a width 160W of the second NCF 160 in the horizontal direction (the X direction).

In order to solve such a problem, in the semiconductor package 10 according to an embodiment, the dam structure 600 may be disposed on the base substrate 500 to surround the first semiconductor chip 100. Also, the thickness 600H of the dam structure 600 may be set to be substantially equal to (or at a level of) the thickness 100H of the first semiconductor chip 100, for limiting and/or preventing an overflow of the first NCF 150 and increasing a filling rate of the first NCF 150 between the base substrate 500 and the first semiconductor chip 100.

Although described below, due to the dam structure 600, a bonding head BH (see FIG. 6F) and the dam structure 600 may temporarily form a closed space near the first semiconductor chip 100 and the first NCF 150 may flow in only the closed space, in a thermal compression bonding process performed on the first semiconductor chip 100. Therefore, the overflow and non-filling of the first NCF 150 may be effectively limited and/or prevented, and an influence on a process of manufacturing another peripheral semiconductor package may be reduced and/or minimized.

Accordingly, the semiconductor package 10 according to an embodiment may be miniaturized and lightened and may be enhanced in productivity and reliability.

Figure 2A:
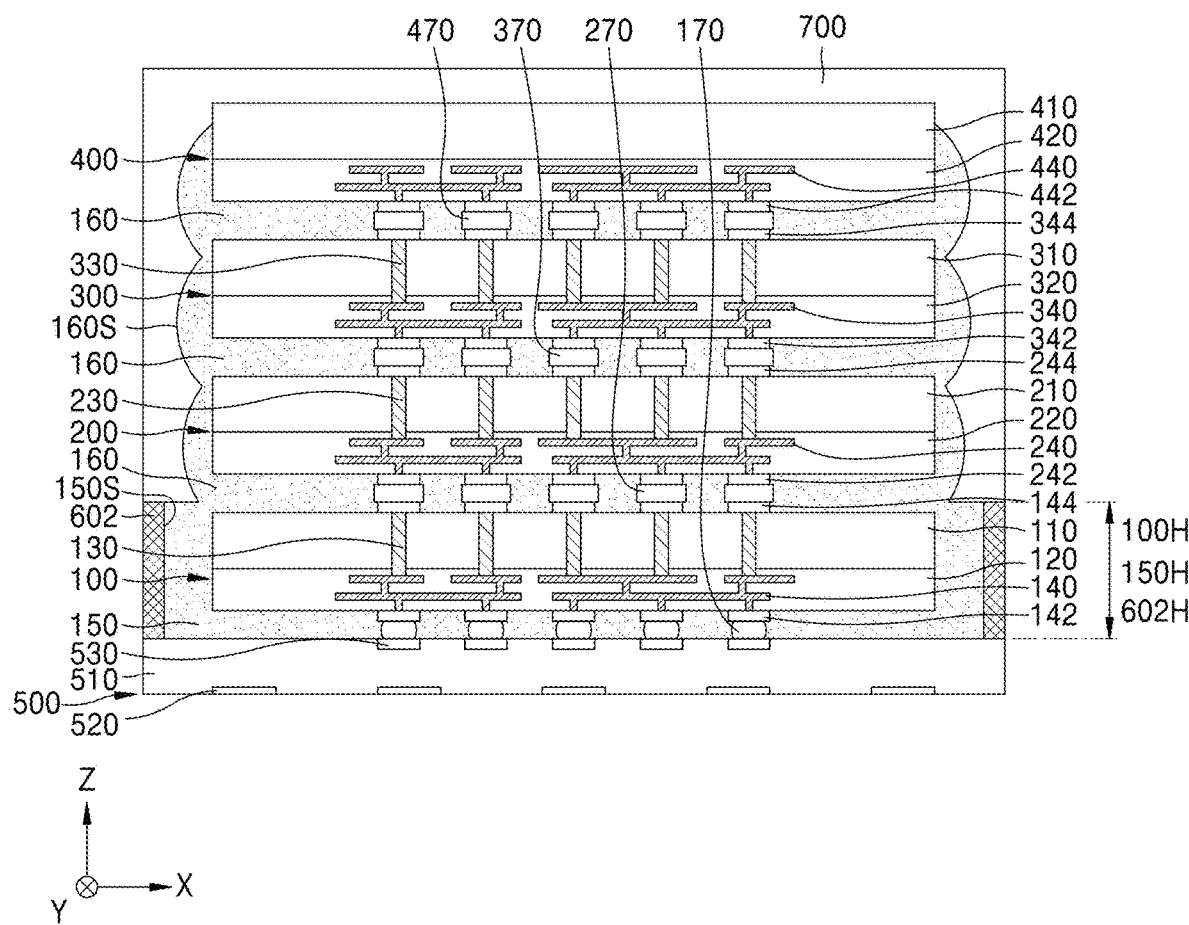
FIGS. 2A and 2B are diagrams illustrating a semiconductor package according to an embodiment.
Figure 2B:
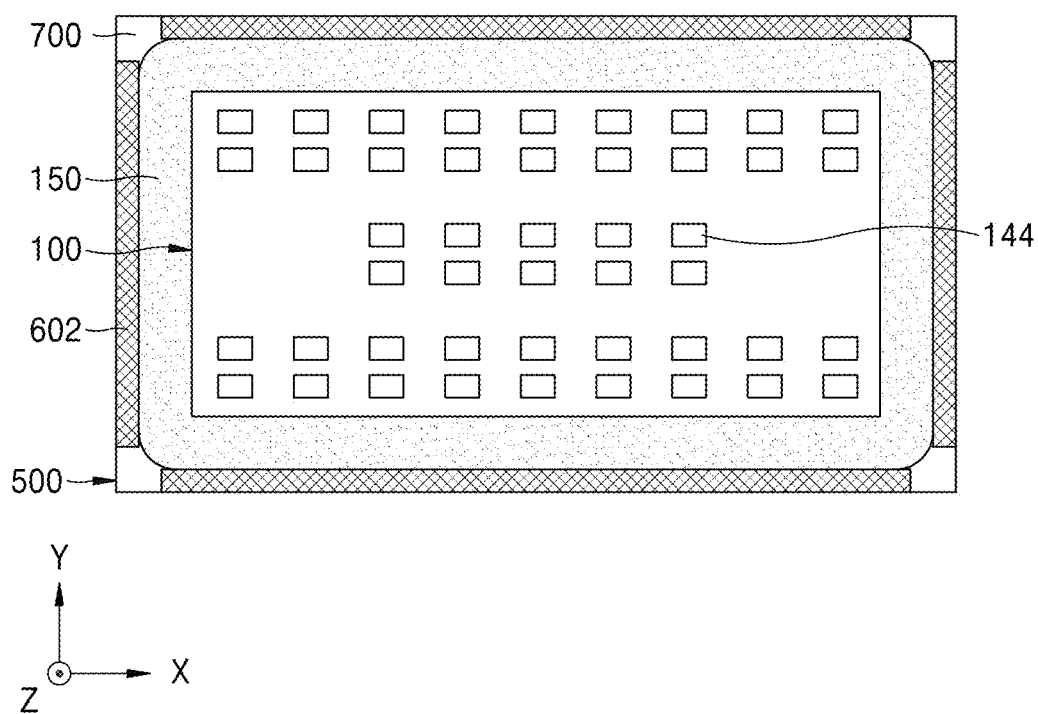

FIGS. 2A and 2B are diagrams illustrating a semiconductor package according to an embodiment.

In detail, FIG. 2A is a side cross-sectional view of the semiconductor package, and FIG. 2B is a plan view of the semiconductor package.

Most elements of a semiconductor package 20 described below and materials of the elements are substantially the same as or similar to descriptions given above with reference to FIGS. 1A to 1C. Therefore, for convenience of description, a difference with the semiconductor package 10 described above (see FIG. 1A) will be mainly described below.

Referring to FIGS. 2A and 2B, the semiconductor package 20 may include a first semiconductor chip 100, a second semiconductor chip 200, a third semiconductor chip 300, and a fourth semiconductor chip 400, which are stacked on a base substrate 500 in a vertical direction (a Z direction).

A dam structure 602 may be disposed on the base substrate 500 to face each side surface of the first semiconductor chip 100 and may be apart therefrom. That is, as seen in a plan view, the dam structure 602 may include four pieces. Therefore, the dam structure 602 may not be formed at a corner portion of the base substrate 500, and the base substrate 500 may directly contact a molding member 700.

A side surface 150S of a first NCF 150 may contact the dam structure 602 to form a flat surface. The dam structure 602 may be disposed apart from the first semiconductor chip 100 by a certain distance and may be formed in a separated structure surrounding each side surface of the first semiconductor chip 100. That is, a portion of an edge of an upper surface of the base substrate 500 may be exposed from the dam structure 602.

A thickness 602H of the dam structure 602 may be substantially the same as a thickness 100H of the first semiconductor chip 100. Also, the thickness 602H of the dam structure 602 may be substantially the same as a thickness 150H of the first NCF 150. Therefore, all of the dam structure 602, the first semiconductor chip 100, and the first NCF 150 may have substantially the same thickness.

In some embodiments, an external connection terminal may not be attached on a lower surface of the base substrate 500. For example, a bottom pad 520 may be an element for direct bonding between bonded pads. However, the present embodiment is not limited thereto.

Figure 3:
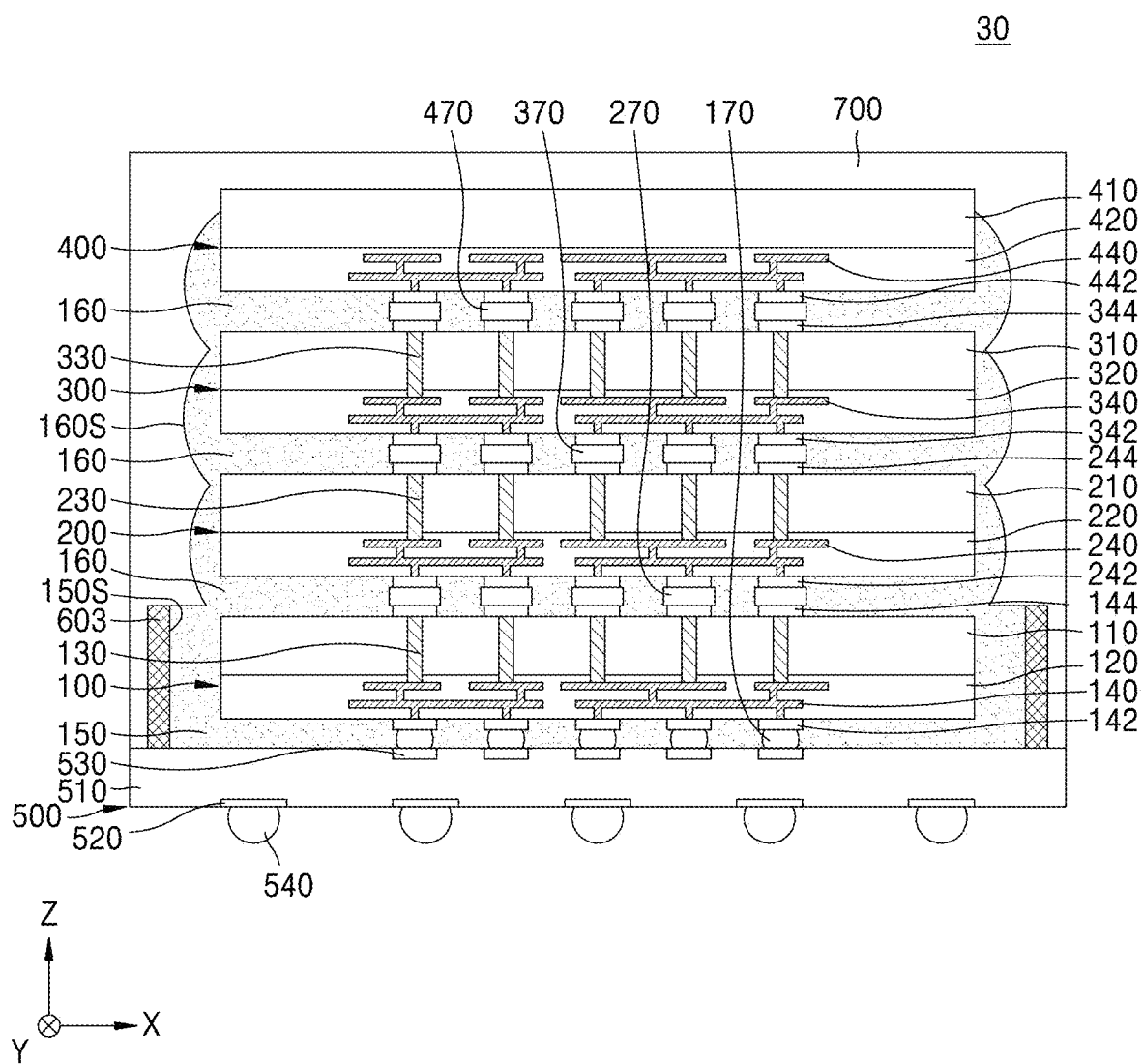
FIGS. 3 to 5 are diagrams illustrating a semiconductor package according to an embodiment.
Figure 4:
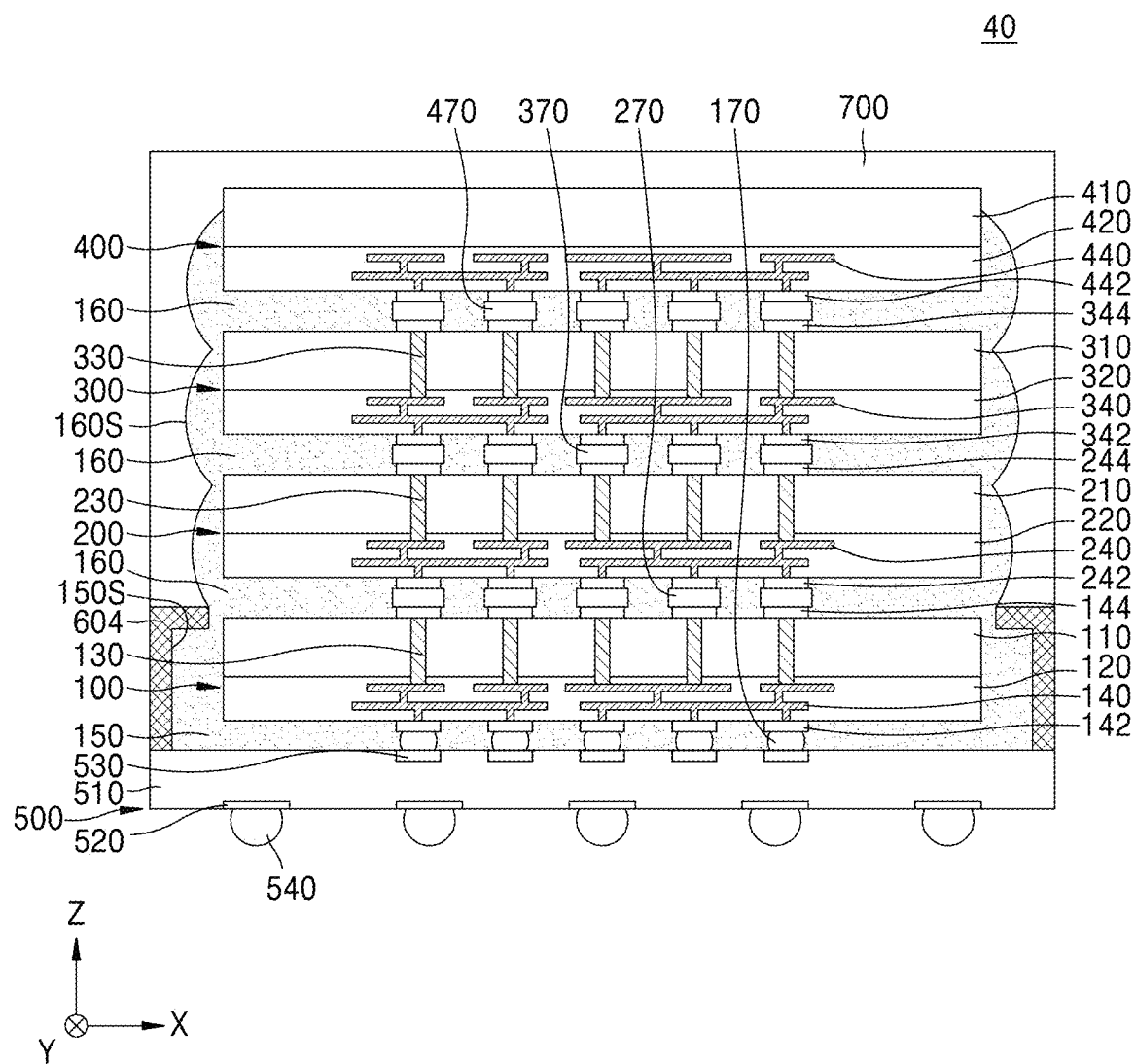
Figure 5:
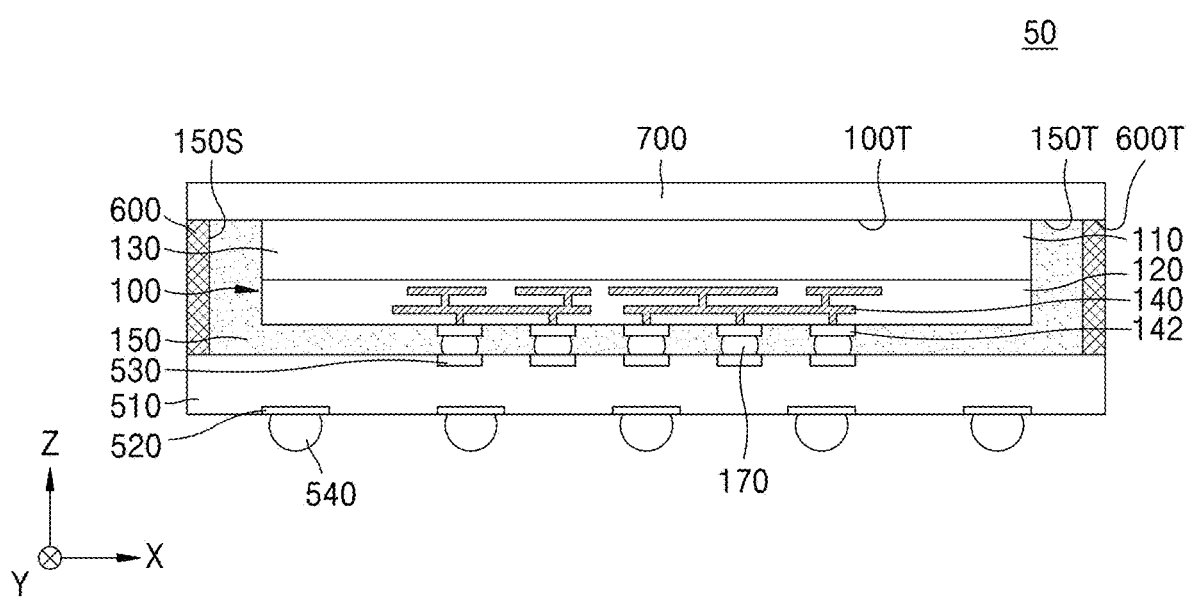

FIGS. 3 to 5 are diagrams illustrating a semiconductor package according to an embodiment.

Most elements of semiconductor packages 30, 40, and 50 described below and materials of the elements are substantially the same as or similar to descriptions given above with reference to FIGS. 1A to 1C. Therefore, for convenience of description, a difference with the semiconductor package 10 described above (see FIG. 1A) will be mainly described below.

Referring to FIG. 3, the semiconductor package 30 may include a first semiconductor chip 100, a second semiconductor chip 200, a third semiconductor chip 300, and a fourth semiconductor chip 400, which are stacked on a base substrate 500 in a vertical direction (a Z direction).

A dam structure 603 may be disposed on the base substrate 500 to surround the first semiconductor chip 100. A side surface 150S of a first NCF 150 may contact the dam structure 603 to form a flat surface. The dam structure 603 may be disposed apart from the first semiconductor chip 100 by a certain distance and may be formed in an integrated structure or a separated structure surrounding a whole side surface of the first semiconductor chip 100.

A molding member 700 may be formed on the base substrate 500 to surround the first to fourth semiconductor chips 100 to 400. The molding member 700 may surround side surfaces of the first to fourth semiconductor chips 100 to 400. In detail, the molding member 700 may be formed to surround the side surfaces of the first to fourth semiconductor chips 100 to 400 and a side surface of a second NCF 160 and not to externally expose the first and second NCFs 150 and 160.

Also, the dam structure 603 may be completely covered by the molding member 700. An inner sidewall of the dam structure 603 may contact the first NCF 150, and an external sidewall of the dam structure 603 may contact the molding member 700. A sidewall of the base substrate 500 may be exposed at the molding member 700, and the exposed sidewall of the base substrate 500 and a side surface of the molding member 700 may be coplanar. That is, the dam structure 603 may not be exposed at a whole side surface of the semiconductor package 30.

Referring to FIG. 4, the semiconductor package 40 may include a first semiconductor chip 100, a second semiconductor chip 200, a third semiconductor chip 300, and a fourth semiconductor chip 400, which are stacked on a base substrate 500 in a vertical direction (a Z direction).

A dam structure 604 may be disposed on the base substrate 500 to surround the first semiconductor chip 100. A side surface 150S of a first NCF 150 may contact the dam structure 604 to form a stepped shape. The dam structure 604 may be disposed apart from the first semiconductor chip 100 by a certain distance and may be formed in an integrated structure or a separated structure surrounding a whole side surface of the first semiconductor chip 100.

The dam structure 604 may include a bent portion of which an upper portion is perpendicularly bent. In other words, the dam structure 604 may have a structure where a portion formed in the vertical direction (the Z direction) and a portion formed in a horizontal direction (an X direction) in the base substrate 500 are coupled to each other at an upper portion thereof.

Referring to FIG. 5, the semiconductor package 50 may include a first semiconductor chip 100 mounted on a base substrate 500.

The first semiconductor chip 100 may be electrically connected to the base substrate 500 through a first connection bump 170. Also, the first semiconductor chip 100 and the base substrate 500 may be attached on each other by a first NCF 150.

The first semiconductor chip 100 may include a first semiconductor substrate 110, a first semiconductor device layer 120 including a first wiring structure 140, a first lower connection pad 142, and a first connection bump 170.

The first semiconductor substrate 110 may include an active surface (a lower surface as illustrated) and an inactive surface (an upper surface as illustrated), which are opposite to each other. The first semiconductor substrate 110 may include the first semiconductor device layer 120 provided on the lower surface of the first semiconductor substrate 110, and the first lower connection pad 142 may be formed on the first semiconductor device layer 120.

A molding member 700 may be formed on the base substrate 500 to surround the first semiconductor chip 100. In detail, the molding member 700 may cover all of an upper surface 100T of the first semiconductor chip 100, an upper surface 150T of the first NCF 150, and an upper surface 600T of the dam structure 604.

FIGS. 6A to 6J are diagrams illustrating a method of manufacturing a semiconductor package in process sequence, according to an embodiment.

A method of manufacturing a semiconductor package may include a process described below. In a case where some embodiments are differently implemented, a specific process may be performed unlike a described sequence. For example, two processes successively described may be substantially and simultaneously performed, or may be performed in an opposite sequence of a described sequence.

Referring to FIG. 6A, a semiconductor wafer 100W including regions which are differentiated from one another where a plurality of first semiconductor chips 100 are to be provided may be prepared.

The semiconductor wafer 100W may include a first semiconductor substrate 110, a first semiconductor device layer 120, and a first through electrode 130. The first semiconductor substrate 110 may include a lower surface 112 and an upper surface 114, which are opposite to each other. The first semiconductor device layer 120 may be formed on an active surface (i.e., the lower surface 112) of the first semiconductor substrate 110. The first through electrode 130 may pass through at least a portion of the first semiconductor substrate 110 and may be connected to a first wiring structure 140 included in the first semiconductor device layer 120.

Subsequently, a first connection pad 142 and a first connection bump 170 electrically connected to the first through electrode 130 may be formed on the lower surface 112 of the first semiconductor substrate 110. A metal layer may be deposited on the lower surface 112 of the first semiconductor substrate 110, and then, by patterning the metal layer, the first connection pad 142 may be formed.

Subsequently, in order to form the first connection bump 170, a mask pattern (not shown) including an opening portion exposing at least a portion of the first connection pad 142 may be formed on the first semiconductor device layer 120, and then, a conductive material layer constituting the first connection bump 170 may be formed on the first connection pad 142 exposed through the opening portion of the mask pattern. For example, the conductive material layer constituting the first connection bump 170 may include a pillar structure and a solder layer, which are sequentially formed through a plating process. Subsequently, the mask pattern may be removed, and by performing a reflow process, the first connection bump 170 having a convex shape may be formed.

Subsequently, an upper passivation layer (not shown) covering an inactive surface (i.e., the upper surface 114) of the first semiconductor substrate 110 may be selectively formed, and then, a first upper connection pad 144 electrically connected to the first through electrode 130 may be formed on the upper passivation layer. The upper passivation layer may be formed to expose the first through electrode 130. The upper passivation layer may include, for example, an insulating polymer material.

Figure 6B:
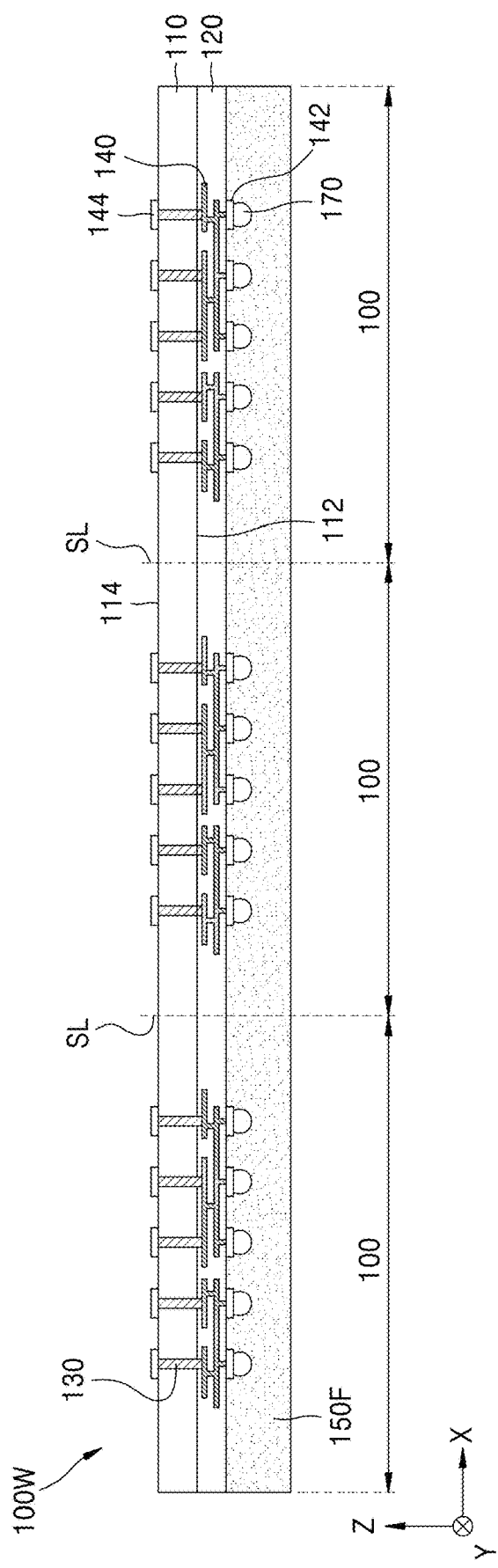

Referring to FIG. 6B, a first NCF 150F may be attached on the first semiconductor device layer 120.

The first NCF 150F may be attached on a semiconductor wafer 100W on which a cutting process is not performed. Also, the first NCF 150F may be attached to cover all of a first connection pad 142 and a first connection bump 170. A portion, where the first connection pad 142 is not provided, of a first semiconductor device layer 120 may directly contact the first NCF 150F.

Figure 6C:
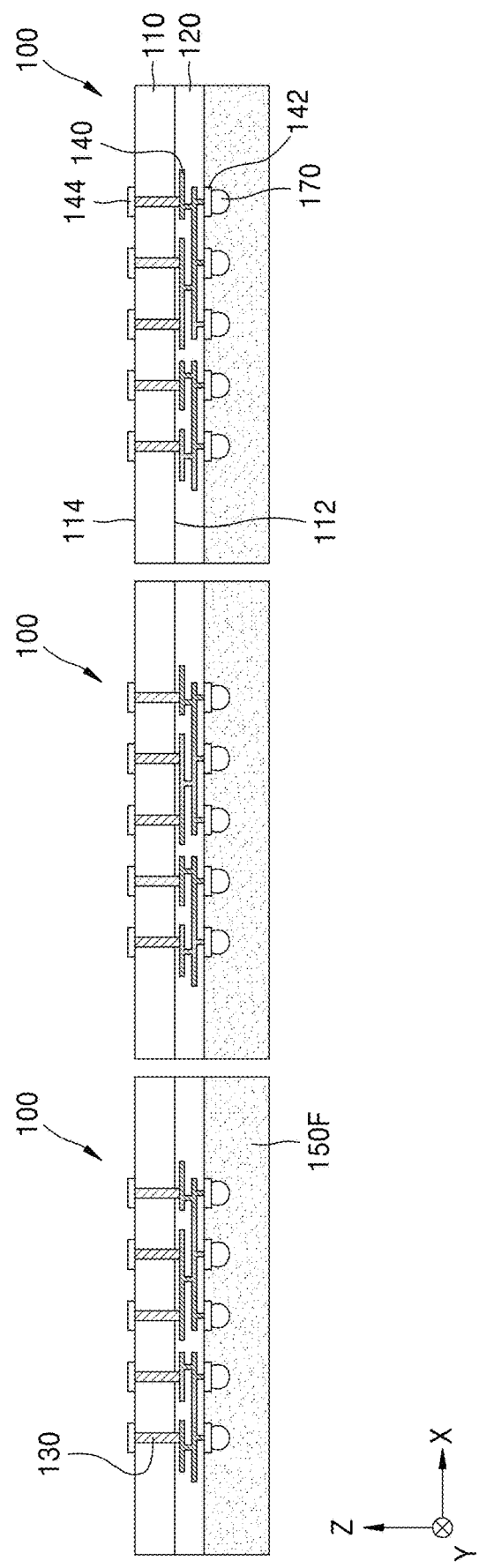

Referring to FIG. 6C, a semiconductor wafer 100W (see FIG. 6B) on which a first NCF 150F is attached may be cut along a scribe lane SL (see FIG. 6B), and thus, may be divided into a plurality of first semiconductor chips 100.

The semiconductor wafer 100W (see FIG. 6B) may be mechanically cut by using a sawing blade. Alternatively, the semiconductor wafer 100W (see FIG. 6B) may be cut based on propagation of a breaking surface by using a laser.

The plurality of first semiconductor chips 100 into which one semiconductor wafer 100W (see FIG. 6B) is divided may include the same individual devices.

Figure 6D:
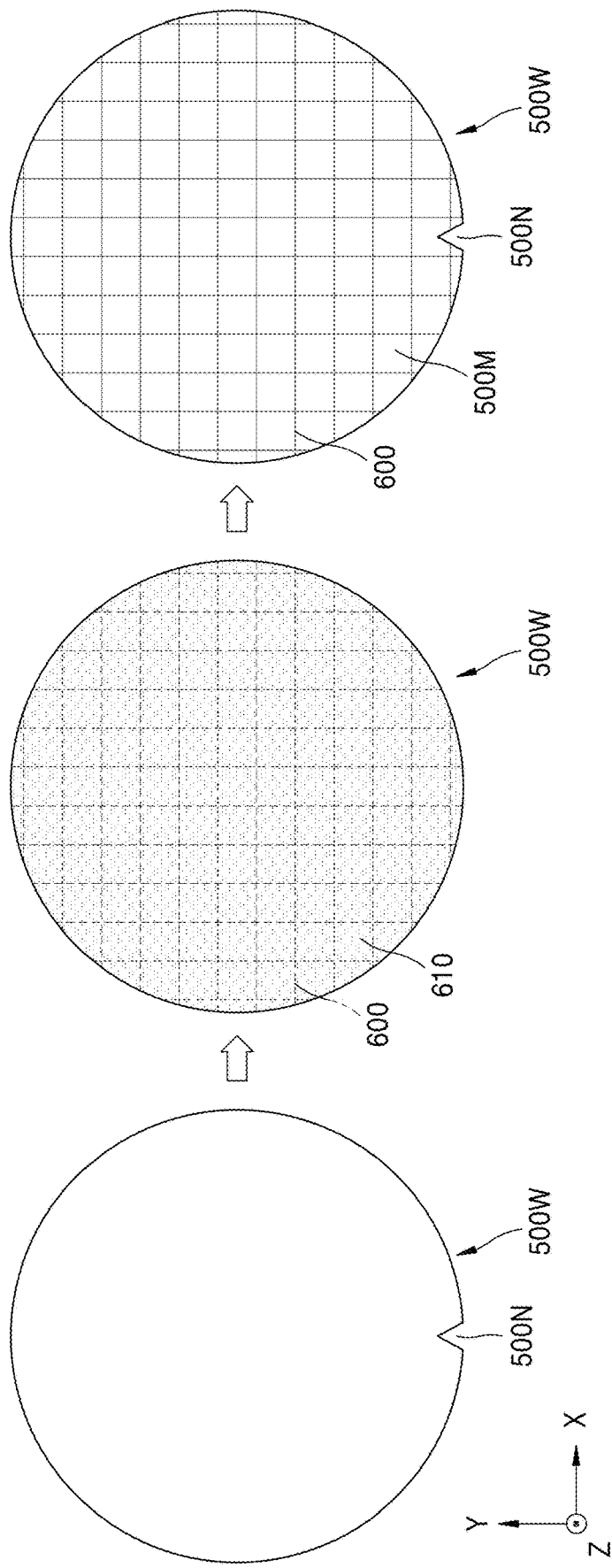

Referring to FIG. 6D, a dam structure 600 may be formed on a base substrate 500W to surround a semiconductor chip mounting region 500M.

The base substrate 500W may be a semiconductor wafer and may have a circular shape having a certain thickness. The base substrate 500W may include a notch 500N used as a reference point for substrate alignment.

Herein, in the base substrate 500W, an interposer based on a semiconductor wafer will be described for example. The base substrate 500W may be assumed to have a diameter of about 12 inches, and a case where a silicon wafer is used will be described. However, it may be understood by those of ordinary skill in the art that the base substrate 500W having a diameter equal to or less than the diameter may be used and the base substrate 500W including a material instead of silicon may be used.

Subsequently, an adhesive film 610 where the dam structure 600 is previously formed may be aligned and attached on an upper surface of the base substrate 500W. The adhesive film 610 may have the same shape as that of the base substrate 500W, and the dam structure 600 may be disposed on one side surface of the adhesive film 610 to have a lattice pattern.

Subsequently, the dam structure 600 may be attached on the upper surface of the base substrate 500W, and then, only the adhesive film 610 may be removed. In an embodiment, the dam structure 600 may be formed to surround the semiconductor chip mounting region 500M, for limiting and/or preventing a first NCF 150F (see FIG. 6E) from overflowing to another peripheral semiconductor package.

Figure 6E:
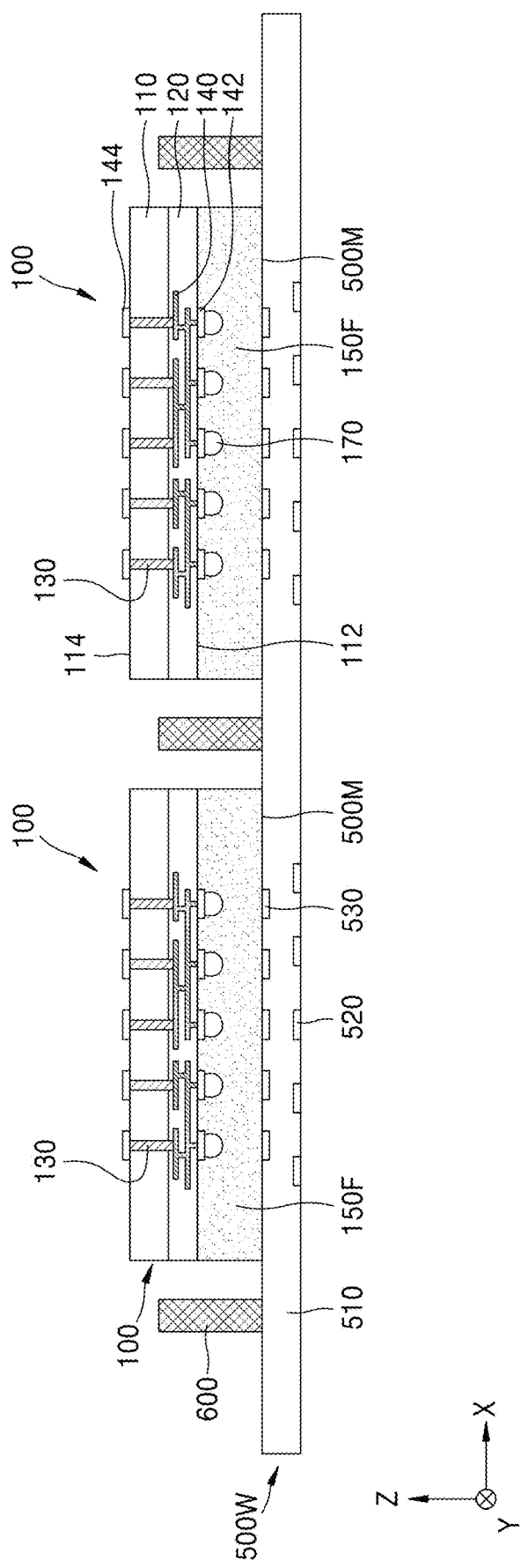

Referring to FIG. 6E, a plurality of first semiconductor chips 100 may be mounted on a base substrate 500W.

The divided plurality of first semiconductor chips 100 may be spaced apart from one another by a certain interval by a semiconductor chip transfer apparatus (not shown) and may be placed in a semiconductor chip mounting region 500M of the base substrate 500W. The interval may be a distance which enables a first NCF 150F to surround a side surface of the first semiconductor chip 100 without a void in a subsequent process.

The first NCF 150F may be disposed between the plurality of first semiconductor chips 100 and the base substrate 500W, and the first connection bump 170 may be disposed to be aligned in a direction (a Z direction) vertical to a top pad 530 of the base substrate 500W.

The plurality of first semiconductor chips 100 may be mounted to fill all of the semiconductor chip mounting region 500M of the base substrate 500W.

Referring to FIG. 6F, a bonding foil BF may be placed between a first semiconductor chip 100 (placed in a left region in the drawing) and a bonding head BH, and heat and pressure may be applied to the first semiconductor chip 100 by using the bonding head BH.

A flat area of a lower portion of the bonding head BH may be greater than that of an upper portion of the first semiconductor chip 100. That is, when a region corresponding to the first semiconductor chip 100 is seen in a plan view, a lower surface of the bonding head BH may cover all of an upper surface of the first semiconductor chip 100.

When pressure is applied to the first semiconductor chip 100 by using the bonding head BH, a first NCF 150 may flow along an edge of the first semiconductor chip 100. In order to limit and/or prevent an overflow of the first NCF 150, pressure may be applied up to a position at which the bonding head BH contacts a dam structure 600. In this case, the first NCF 150 may flow in only a closed space formed by the bonding head BH and the dam structure 600.

The bonding foil BF may limit and/or prevent pollution from occurring in an upper surface of the first NCF 150 and/or a lower surface of the bonding head BH. The bonding foil BF may be designed so that the bonding foil BF is provided as a roll type, and after thermal compression bonding, is again wound as the roll type. As described above, providing and winding of the bonding foil BF may be performed in a roll-to-roll manner, and thus, providing of the bonding foil BF may be continuously performed and the bonding foil BF may be maintained to be tight in a thermal compression bonding process.

Due to a process of forming the closed space, a thickness 600H of the dam structure 600 and a thickness 100H of the first semiconductor chip 100 may be substantially the same. Also, the thickness 600H of the dam structure 600 and a thickness 150H of the first NCF 150 may be substantially the same. Therefore, all of the dam structure 600, the first semiconductor chip 100, and the first NCF 150 may have substantially the same thickness.

Figure 6G:
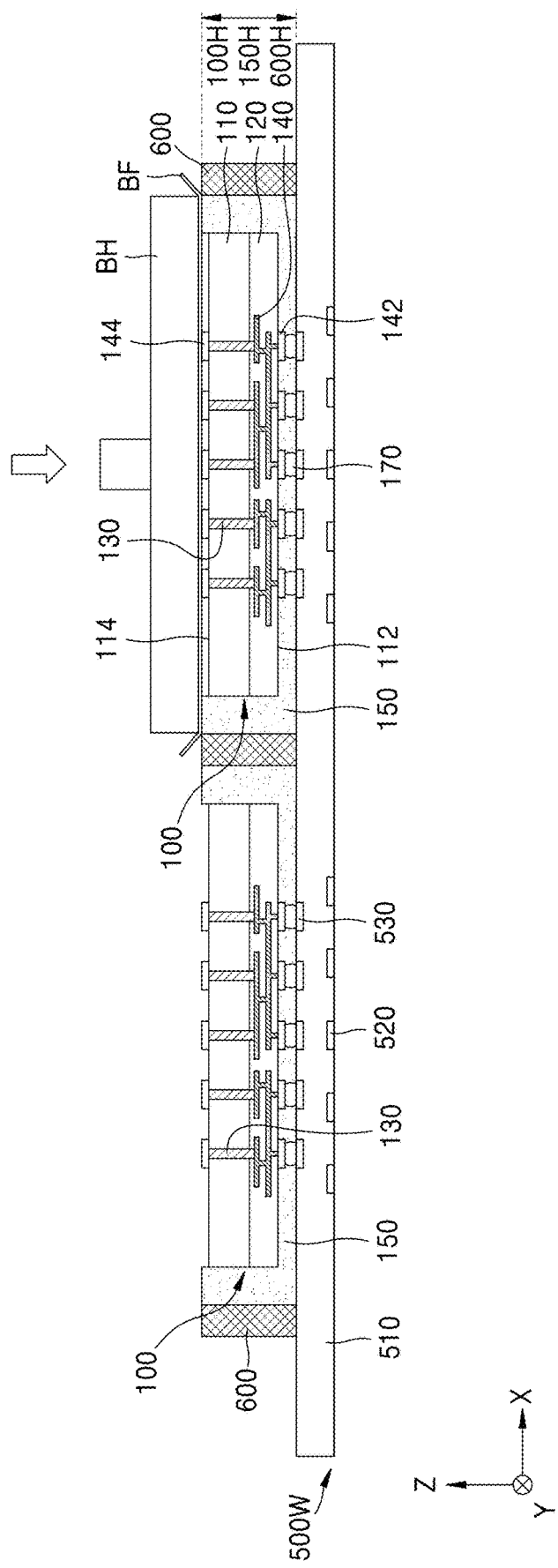

Referring to FIG. 6G, a bonding foil BF may be placed between a first semiconductor chip 100 (placed in a right region in the drawing) and a bonding head BH, and heat and pressure may be applied to the first semiconductor chip 100 by using the bonding head BH.

Since a first NCF 150 does not overflow in thermal compression bonding performed on a first semiconductor chip 100 (placed in a left region in the drawing), the first semiconductor chip 100 may be free without being affected by a periphery in a thermal compression bonding process performed on the first semiconductor chip 100 (placed in the right region in the drawing).

Description associated with thermal compression bonding is the same as description given above, and thus, is omitted herein.

Figure 6H:
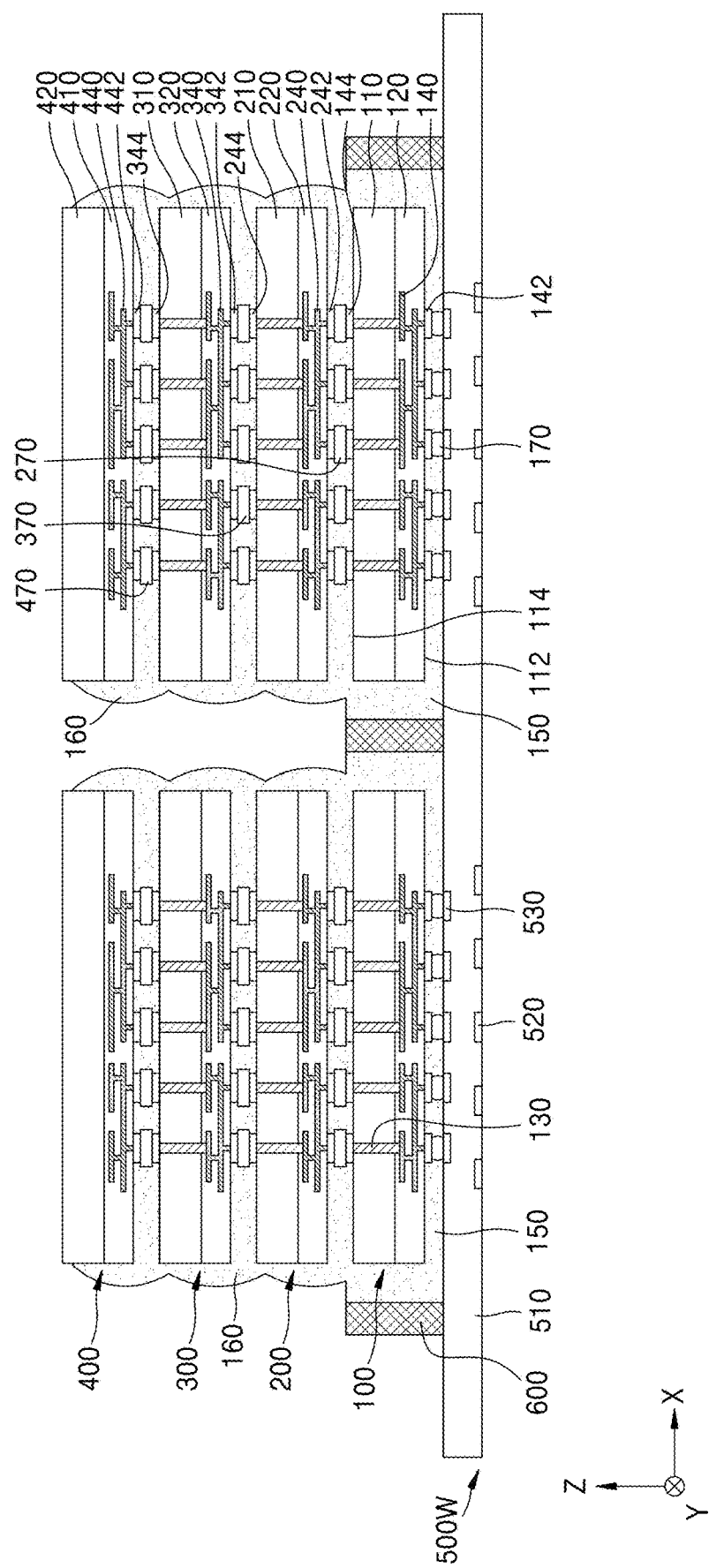

Referring to FIG. 6H, a second semiconductor chip 200, a third semiconductor chip 300, and a fourth semiconductor chip 400 may be sequentially stacked on each of a plurality of first semiconductor chips 100 mounted on a base substrate 500W.

First, the second to fourth semiconductor chips 200 to 400 may be prepared. The second semiconductor chip 200 and the third semiconductor chip 300 may be provided based on a manufacturing method which is the same as or similar to the above-described manufacturing method. The fourth semiconductor chip 400 may be provided without performing a process of forming a through electrode and an upper connection pad.

The first to fourth semiconductor chips 100 to 400 may be the same semiconductor chips each including an individual device. On the other hand, at least one of the first to fourth semiconductor chips 100 to 400 may be a different semiconductor chip including a different individual device.

Subsequently, the second semiconductor chip 200 may be aligned and stacked on the first semiconductor chip 100 to correspond to the first semiconductor chip 100. A second NCF 160 may be disposed between the first semiconductor chip 100 and the second semiconductor chip 200, and the second connection bump 270 may be connected to the first upper connection pad 144.

As described above, the second NCF 160 may be provided by being attached on a lower surface of the second semiconductor chip 200 before the second semiconductor chip 200 is stacked on the first semiconductor chip 100.

Subsequently, the second semiconductor chip 200 may be stacked on the first semiconductor chip 100, and then, heat and pressure may be applied to the second semiconductor chip 200 by using a bonding head BH (see FIG. 6F). Therefore, the second NCF 160 may be cured, and in some embodiments, an intermetallic compound may be formed between the second connection bump 270 and a first upper connection pad 144, thereby decreasing a contact resistance.

Subsequently, by performing the same process as a process of stacking the second semiconductor chip 200 on the first semiconductor chip 100, the third semiconductor chip 300 may be stacked on the second semiconductor chip 200 and the fourth semiconductor chip 400 may be stacked on the third semiconductor chip 300.

Figure 6I:
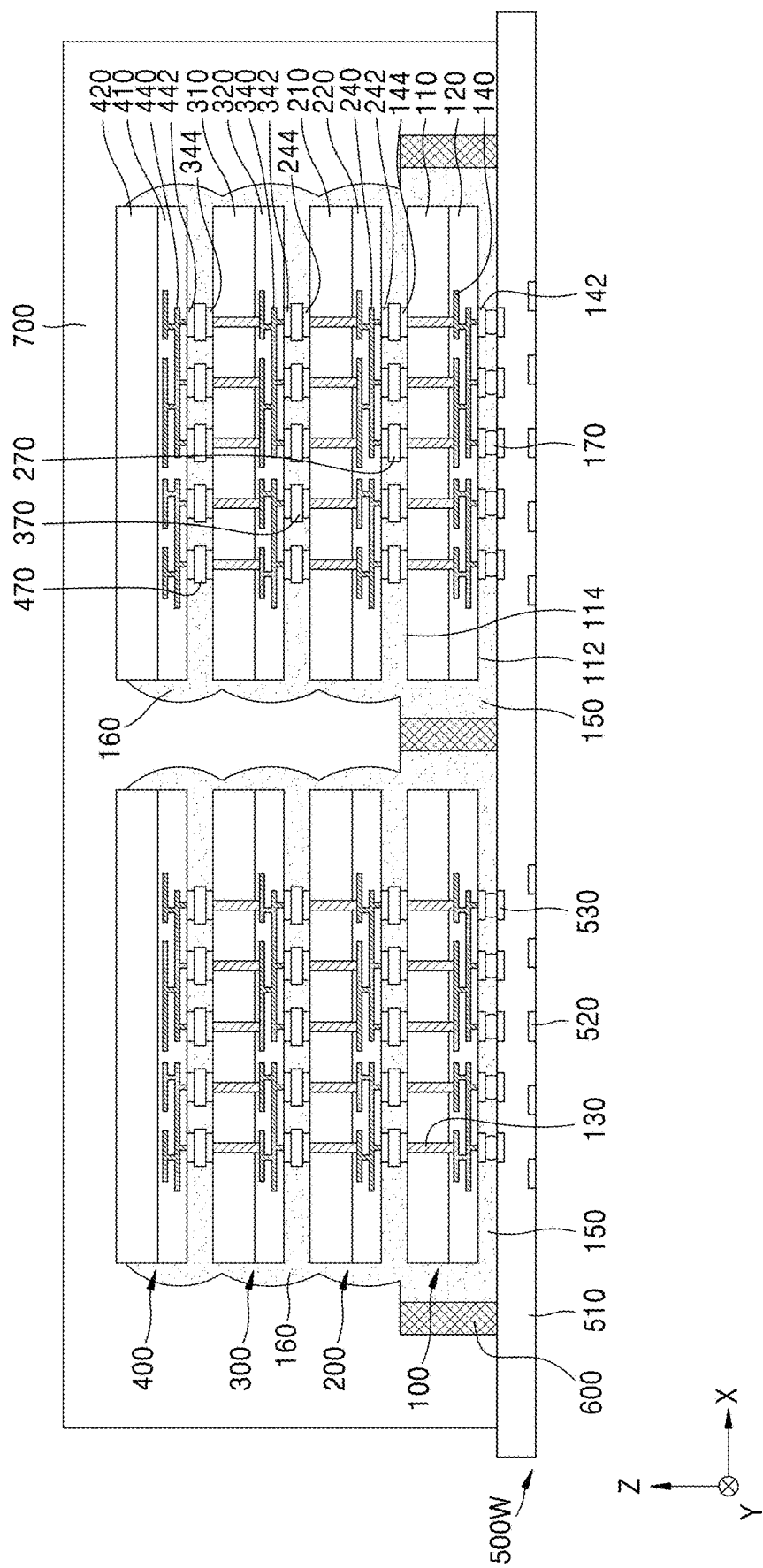

Referring to FIG. 6I, a molding member 700 covering first to fourth semiconductor chips 100 to 400 may be formed on a base substrate 500W.

The molding member 700 may be formed to cover side surfaces of the first to fourth semiconductor chips 100 to 400 and an upper surface of the fourth semiconductor chip 400. Also, the molding member 700 may be formed to surround a side surface of a second NCF 160 and not to externally expose a first NCF 150 and the second NCF 160. Also, the molding member 700 may be formed to surround a dam structure 600.

Figure 6J:
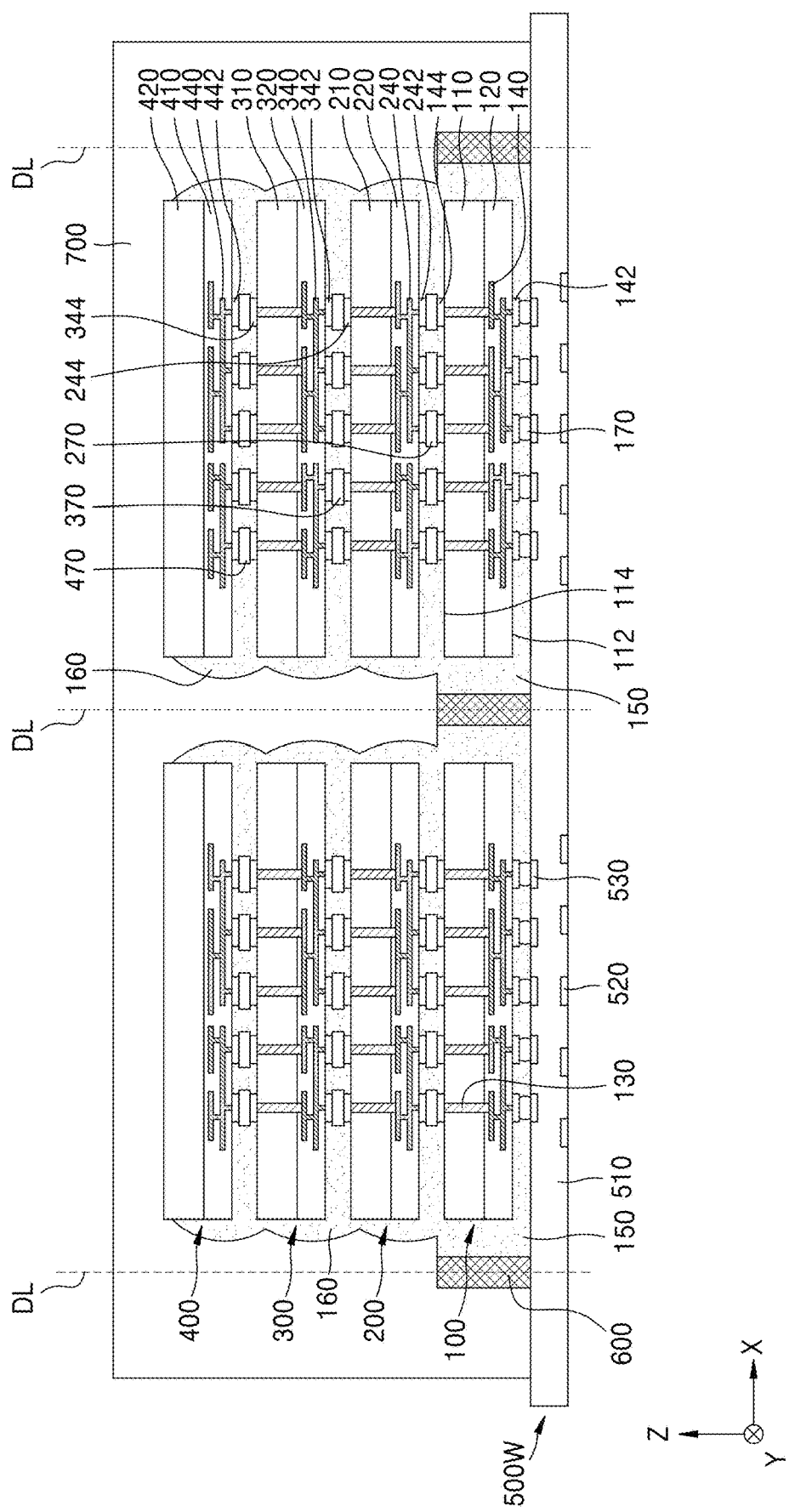

Referring to FIG. 6J, a plurality of semiconductor packages 10 (see FIG. 1A) including first to fourth semiconductor chips 100 to 400 may be divided by performing a cutting process along a dicing line DL.

Other elements including the molding member 700 may be cut along the dicing line DL, and thus, may be divided into the semiconductor packages 10. A dam structure 600 may be cut along the dicing line DL together. That is, a cut outer sidewall of the dam structure 600 may be exposed by the molding member 700, and the exposed outer sidewall of the dam structure 600 and a side surface of the molding member 700 may be coplanar.

The semiconductor package 10 (see FIG. 1A) manufactured through the above-described manufacturing method, according to an embodiment, may be miniaturized and lightened and may be enhanced in productivity and reliability.

Figure 7:
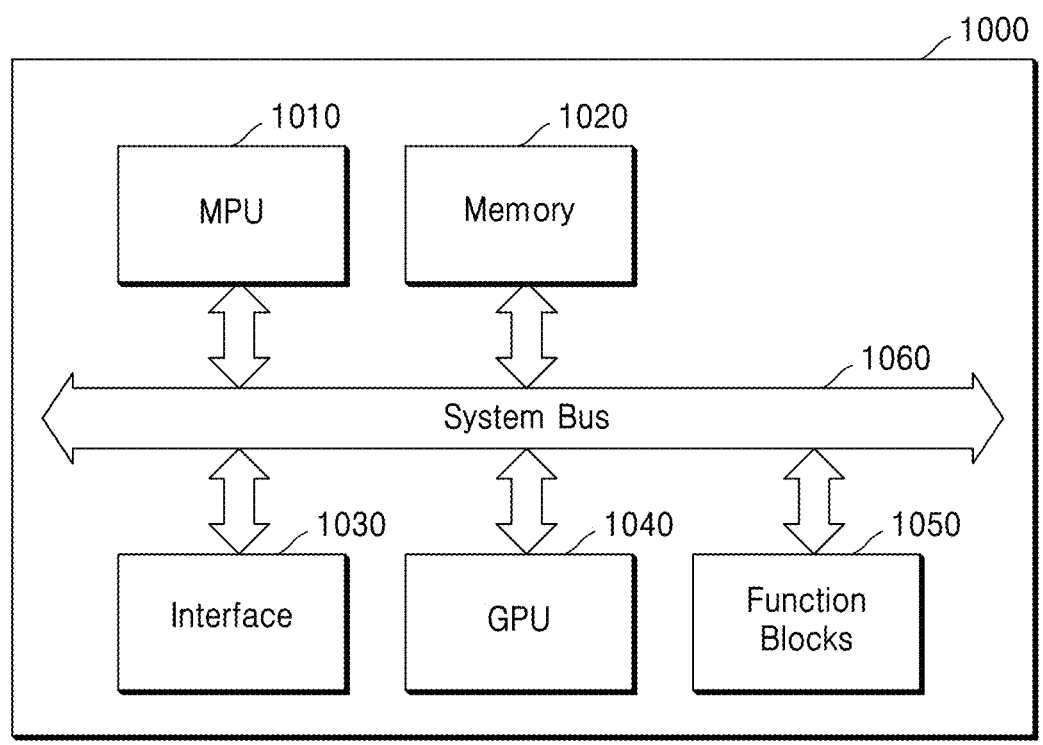
FIG. 7 is a diagram illustrating a configuration of a semiconductor package according to an embodiment.

FIG. 7 is a diagram illustrating a configuration of a semiconductor package 1000 according to an embodiment.

Referring to FIG. 7, the semiconductor package 1000 may include a micro-processing unit (MPU) 1010, a memory 1020, an interface 1030, a graphics processing unit (GPU) 1040, functional blocks 1050, and a bus 1060 connecting the elements. The semiconductor package 1000 may include all of the MPU 1010 and the GPU 1040, or may include only one of the MPU 1010 and the GPU 1040.

The MPU 1010 may include a core and an L2 cache. For example, the MPU 1010 may include a multicore. Cores of the multicore may have the same function or different functions. Also, the cores of the multicore may be simultaneously activated, or may be activated at different times.

The memory 1020 may store a result of processing by each of the functional blocks 1050 on the basis of control by the MPU 1010. The interface 1030 may transmit and receive information or a signal to and from external devices. The GPU 1040 may perform graphics functions. For example, the GPU 1040 may perform video codec, or may process three-dimensional (3D) graphics. The functional blocks 1050 may perform various functions. For example, when the semiconductor package 1000 is an application processor applied to mobile devices, some of the functional blocks 1050 may perform a communication function.

In some embodiments, the MPU 1010, Interface 1030, GPU 1040, functional blocks 1050 may be implemented with processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), an analog element (e.g., circuit), an application processor, etc. The memory 1020 may include a volatile memory chip such as dynamic random access memory (RAM) (DRAM) or static RAM (SRAM), or may include a non-volatile memory chip such as phase-change RAM (PRAM), magnetoresistive RAM (MRAM), ferroelectric RAM (FeRAM), resistive RAM (RRAM), a high bandwidth memory (HBM), or a combination thereof.

The semiconductor package 1000 may include one of the semiconductor packages 10 to 50 described above with reference to FIGS. 1A to 5.

While inventive concepts has been particularly shown and described with reference to embodiments thereof, it will be understood that various changes in form and details may be made therein without departing from the spirit and scope of the following claims.

What is claimed is:

1. A method of manufacturing a semiconductor package, the method comprising:
  preparing a base substrate including a semiconductor chip mounting region;
  forming a dam structure on the base substrate, the dam structure surrounding the semiconductor chip mounting region;

mounting a first semiconductor chip on the semiconductor chip mounting region of the base substrate, the first semiconductor chip having a first non-conductive film attached thereto;

applying a pressure to the first semiconductor chip such that the first non-conductive film is in contact with the dam structure;

stacking a second semiconductor chip on the first semiconductor chip, the second semiconductor chip having a second non-conductive film attached thereto; and forming a molding member covering the base substrate, the first semiconductor chip, and the second semiconductor chip.

2. The method of claim 1, wherein, after the forming of the molding member, a side surface of the first non-conductive film is a flat surface, and a side surface of the second non-conductive film is a curved surface.

3. The method of claim 1, wherein, in the applying of a pressure to the first semiconductor chip, the pressure is adjusted such that an upper surface of the first non-conductive film and an upper surface of the dam structure are at substantially a same level.

4. The method of claim 1, wherein, after the forming of the molding member, a width of the first non-conductive film is greater than a width of the second non-conductive film.

5. The method of claim 1, wherein, after the forming of the molding member, one sidewall of the dam structure is exposed at the molding member to provide an exposed one sidewall.

6. The method of claim 1, wherein, after the forming of the molding member, all sidewalls of the dam structure are covered by the molding member to be prevented from being exposed to outside.

7. The method of claim 1, wherein, as seen in a plan view, the dam structure is spaced apart from the first semiconductor chip by a certain distance, and the dam structure has an integrated structure and surrounds each side surface of the first semiconductor chip.

8. The method of claim 1, wherein, as seen in a plan view, the dam structure is spaced apart from the first semiconductor chip by a certain distance, and the dam structure has a separate structure and faces each side surface of the first semiconductor chip.

9. The method of claim 1, wherein, as seen in a side surface, the dam structure includes a bent portion, and an upper portion of the dam structure is perpendicularly bent.

10. The method of claim 1, further comprising, after the stacking of the second semiconductor chip, stacking one or more semiconductor chips on the second semiconductor chip.

11. A method of manufacturing a semiconductor package, the method comprising:

preparing a semiconductor wafer including a region in which a plurality of semiconductor chips are provided;

attaching a first non-conductive film to the semiconductor wafer;

splitting the semiconductor wafer into a plurality of first semiconductor chips, by cutting the semiconductor wafer along a scribe lane;

preparing a base substrate including a plurality of semiconductor chip mounting regions;

forming a plurality of dam structures on the base substrate, the plurality of dam structures surrounding the plurality of semiconductor chip mounting regions;

mounting the plurality of first semiconductor chips on the plurality of semiconductor chip mounting regions of the base substrate;

disposing a bonding foil on each of the plurality of first semiconductor chips, and applying a pressure to the plurality of first semiconductor chips by using a bonding head;

stacking a second semiconductor chip, a third semiconductor chip, and a fourth semiconductor chip on each of the plurality of first semiconductor chips mounted on the base substrate;

forming a molding member on the base substrate, the molding member covering the first to fourth semiconductor chips; and splitting the base substrate into a plurality of semiconductor packages including the first to fourth semiconductor chips, by cutting the base substrate along a dicing line.

12. The method of claim 11, wherein, in the splitting of the base substrate into the plurality of semiconductor packages, one sidewall of a corresponding dam structure among the plurality of dam structures is cut to be exposed at the molding member to provide an exposed sidewall of the exposed one sidewall of the corresponding dam structure, and the exposed one sidewall of the corresponding dam structure, a side surface of the molding member, and a side surface of the base substrate are coplanar.

13. The method of claim 11, wherein, in the splitting of the base substrate into the plurality of semiconductor packages, a corresponding dam structure among the plurality of dam structures is cut to be entirely covered by the molding member, one sidewall of the corresponding dam structure contacts the first non-conductive film, another sidewall of the corresponding dam structure contacts the molding member, and a side surface of the molding member and a side surface of the base substrate are coplanar.

14. The method of claim 11, wherein, in the applying of a pressure to the plurality of first semiconductor chips, the pressure is adjusted such that an upper surface of the first non-conductive film and an upper surface of the plurality of dam structures are at a substantially same level.

15. The method of claim 11, wherein, in the applying of a pressure to the plurality of first semiconductor chips, heat and pressure are applied to the plurality of first semiconductor chips.

16. A method of manufacturing a semiconductor package, the method comprising:

preparing a base substrate including a semiconductor chip mounting region;

forming a dam structure on the base substrate, the dam structure surrounding the semiconductor chip mounting region;

mounting a plurality of semiconductor chips on the semiconductor chip mounting region of the base substrate, each of the plurality of semiconductor chips comprising a through electrode therein;

forming a plurality of non-conductive films on lower surfaces of the plurality of semiconductor chips; and forming a molding member covering the base substrate and the plurality of semiconductor chips, wherein an upper surface of a lowermost semiconductor chip of the plurality of semiconductor chips and an upper surface of the dam structure are at a substantially same level.

17. The method of claim 16, wherein each of the plurality of non-conductive films includes a flux and has a constant viscosity,
the molding member includes an epoxy molding compound, and
a material of the dam structure differs from a material of the plurality of non-conductive films and a material of the molding member.

18. The method of claim 16, wherein, among the plurality of non-conductive films, a side surface of a lowermost non-conductive film is a flat surface contacting the dam structure, and
a side surface of each of other non-conductive films is a curved surface.

19. The method of claim 18, wherein, among the plurality of non-conductive films, a width of the lowermost non-conductive film is greater than a width of each of the other non-conductive films.

20. The method of claim 16, wherein the plurality of non-conductive films contact one another and side surfaces of the plurality of semiconductor chips below an uppermost semiconductor chip among the plurality of semiconductor chips.

* * * * *